(12) United States Patent
Qi et al.

(10) Patent No.: US 10,193,100 B2
(45) Date of Patent: Jan. 29, 2019

(54) ARRAY SUBSTRATE, FABRICATING METHOD THEREOF, AND DISPLAY DEVICE

(71) Applicant: Boe Technology Group Co., LTD., Beijing (CN)

(72) Inventors: Yonglian Qi, Beijing (CN); Feng Zhang, Beijing (CN); Dongfang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/906,260

(22) PCT Filed: Jul. 20, 2015

(86) PCT No.: PCT/CN2015/084429
§ 371 (c)(1),
(2) Date: Jan. 19, 2016

(87) PCT Pub. No.: WO2016/123917
PCT Pub. Date: Aug. 11, 2016

(65) Prior Publication Data
US 2016/0372698 A1   Dec. 22, 2016

(30) Foreign Application Priority Data

Feb. 3, 2015   (CN) .......................... 2015 1 0057108

(51) Int. Cl.
| | | |
|---|---|---|
| *H01L 27/00* | (2006.01) | |
| *H01L 51/52* | (2006.01) | |
| *H01L 27/32* | (2006.01) | |
| *H01L 51/56* | (2006.01) | |
| *H01L 29/786* | (2006.01) | |
| *H01L 27/12* | (2006.01) | |

(52) U.S. Cl.
CPC ........ *H01L 51/5228* (2013.01); *H01L 27/127* (2013.01); *H01L 27/1225* (2013.01);
(Continued)

(58) Field of Classification Search
CPC ............. H01L 51/5228; H01L 51/5218; H01L 51/5234; H01L 51/0545; H01L 2251/5353
See application file for complete search history.

(56) References Cited

U.S. PATENT DOCUMENTS

| | | |
|---|---|---|
| 2004/0108810 A1 | 6/2004 | Tsujimura et al. |
| 2004/0256620 A1 | 12/2004 | Yamazaki et al. |

(Continued)

FOREIGN PATENT DOCUMENTS

| | | |
|---|---|---|
| CN | 1573846 A | 2/2005 |
| CN | 101568877 | 10/2009 |

(Continued)

OTHER PUBLICATIONS

International Search Report and Written Opinion with English Language Translation, dated Oct. 8, 2015, Application No. PCT/CN2015/084429.

(Continued)

*Primary Examiner* — Mounir Amer
*Assistant Examiner* — Alexander Belousov
(74) *Attorney, Agent, or Firm* — Womble Bond Dickinson (US) LLP

(57) ABSTRACT

The present invention relates to an array substrate, a fabricating method thereof, and a display device. The array substrate comprises a thin film transistor, an auxiliary electrode which is arranged in a same layer as an active layer of the thin film transistor, and a transparent cathode which is electrically connected with the auxiliary electrode, wherein the active layer is an oxide semiconductor, and the auxiliary electrode is an electric conductor which is formed by performing a modification treatment on the oxide semiconductor. According to technical solutions of the present invention, the active layer and the auxiliary electrode are arranged in a same layer, a pattern of the active layer and the
(Continued)

auxiliary electrode can be formed by a same etching process, and a separate process for forming the auxiliary electrode is not required, thus reducing the overall process time of the array substrate and saving the fabricating cost.

13 Claims, 2 Drawing Sheets

(52) U.S. Cl.
CPC ...... *H01L 27/3258* (2013.01); *H01L 29/7869* (2013.01); *H01L 51/5218* (2013.01); *H01L 51/5234* (2013.01); *H01L 51/56* (2013.01); *H01L 2227/323* (2013.01); *H01L 2251/5353* (2013.01)

(56) References Cited

U.S. PATENT DOCUMENTS

| | | | |
|---|---|---|---|
| 2007/0066178 A1* | 3/2007 | Yamada | H01L 51/5228 445/24 |
| 2014/0049456 A1 | 2/2014 | Iida et al. | |
| 2014/0108810 A1 | 4/2014 | Chenna | |
| 2014/0346465 A1* | 11/2014 | Kim | H01L 27/326 257/40 |
| 2015/0214860 A1* | 7/2015 | Tanaka | H02N 1/002 310/309 |

FOREIGN PATENT DOCUMENTS

| | | |
|---|---|---|
| CN | 101568877 A | 10/2009 |
| CN | 103700694 A | 4/2014 |
| CN | 104183781 | 12/2014 |
| CN | 104183781 A | 12/2014 |
| CN | 104637956 | 5/2015 |

OTHER PUBLICATIONS

Office Action in Chinese Application No. 201510057108.9 dated Feb. 4, 2017, with English translation. 10 pages.
"Third office action," CN Application No. 201510057108.9 (dated Jan. 3, 2018).
Office Action in Chinese Application No. 201510057108.9 dated Jul. 12, 2017, with English translation.

* cited by examiner

ARRAY SUBSTRATE, FABRICATING METHOD THEREOF, AND DISPLAY DEVICE

FIELD OF THE INVENTION

The present invention relates to the field of display technology, and particularly to an array substrate, a display device, and a method for fabricating an array substrate.

BACKGROUND OF THE INVENTION

During fabricating a transmission type structure and a top emission assembly in a large-size inverted OLED (organic light emitting diode) display panel, it is required that light should emit from a cathode. In case the cathode is thin, there is no need to consider its work function However, in case the cathode is very thin, the cathode may suffer from problems like disconnection or its metal tends to be oxidized, so that the conductivity of the cathode is not satisfactory. Besides, since an OLED is drove by a current, in case a external wire is too long or thin, there is a large voltage gradient between the OLED and the external circuit, so that a voltage which is actually applied to the OLED decreases, and the intensity of light from an OLED panel is reduced. Meanwhile, since the resistivity of ITO from which an anode is formed is relatively large, this easily leads to external power consumption. Therefore, in the existing technology, an auxiliary electrode is provided to reduce voltage gradient, increase light path, and reduce driving voltage. In particular, the auxiliary electrode can be made from Cr, Al, Cr/Al/Cr, Mo/Al/Mo, or the like.

However, during fabricating the auxiliary electrode, it is required to add a process for sputtering metal and a process for etching, which increases the fabricating cost of OLED.

SUMMARY OF THE INVENTION

The present invention intends to solve a technical problem of simplifying fabrication of an auxiliary electrode in an inverted OLED device, thus simplifying a fabricating process of the OLED device and reducing fabricating cost.

To this end, the following technical solutions are adopted in embodiment of the present invention.

In a first aspect, the present invention provides an array substrate, comprising: a thin film transistor, an auxiliary electrode which is arranged in a same layer as an active layer of the thin film transistor, and a transparent cathode which is electrically connected with the auxiliary electrode, wherein the active layer is an oxide semiconductor, and the auxiliary electrode is an electric conductor which is formed by performing a modification treatment on the oxide semiconductor.

The array substrate can further comprise: a substrate; a gate which is arranged over the substrate; and a gate insulating layer which is arranged over the gate, wherein the active layer is arranged on the gate insulating layer.

Preferably, the array substrate can further comprise:
a first etch-stopping layer which is arranged on the auxiliary electrode, wherein a via hole is arranged in the first etch-stopping layer, and the transparent cathode is electrically connected with the auxiliary electrode though the via hole in the first etch-stopping layer.

Preferably, the array substrate can further comprise:
a second etch-stopping layer which is arranged on the active layer, and a source and a drain which are arranged on the second etch-stopping layer, wherein the source and the drain are electrically connected with the active layer by means of the via hole in the second etch-stopping layer, respectively.

Preferably, the array substrate can further comprise:
a passivation layer which is arranged on the gate insulating layer and covers the first etch-stopping layer, wherein a via hole is arranged in the passivation layer, the transparent cathode is electrically connected with the auxiliary electrode though the via hole in the first etch-stopping layer and the via hole in the passivation layer.

Preferably, the array substrate can further comprise:
a passivation layer which is arranged on the gate insulating layer and covers the source, the drain, and the first etch-stopping layer, wherein a via hole is arranged in the passivation layer, the transparent cathode is electrically connected with the auxiliary electrode though the via hole in the first etch-stopping layer and the via hole in the passivation layer.

Preferably, the array substrate can further comprise:
a passivation layer which is arranged on the gate insulating layer and covers the source, the drain, the first etch-stopping layer, and the second etch-stopping layer, wherein a via hole is arranged in the passivation layer, the transparent cathode is electrically connected with the auxiliary electrode though the via hole in the first etch-stopping layer and the via hole in the passivation layer.

Preferably, in the array substrate, the auxiliary electrode is an electric conductor which is formed by performing a plasma treatment or ion implantation on the oxide semiconductor.

Preferably, the array substrate can further comprise: an electron injection layer, an electron transporting layer, a light emitting layer, a hole transporting layer, a hole injection layer, and a reflective anode which are arranged in sequence over the transparent cathode.

In a second aspect, the present invention provides a display device, comprising any one of the array substrate as discussed above.

In a third aspect, the present invention provides a method for fabricating an array substrate, comprising:
forming a layer of oxide semiconductor;
performing a patterning process on the layer of oxide semiconductor, to form an active layer of a thin film transistor, and form an auxiliary electrode pattern in a predefined region;
performing a modification treatment on the auxiliary electrode pattern to form an auxiliary electrode; and
forming a transparent cathode which is electrically connected with the auxiliary electrode.

Preferably, prior to forming the layer of oxide semiconductor, the method can further comprise:
forming a gate on a substrate;
forming a gate insulating layer on the gate; and
forming the layer of oxide semiconductor on the gate insulating layer.

Preferably, after performing the patterning process on the layer of oxide semiconductor, the method can further comprise:
forming a first etch-stopping layer on the auxiliary electrode pattern.

Preferably, in the method, performing the modification treatment on the auxiliary electrode pattern can comprise:
performing the modification treatment on the auxiliary electrode pattern through the first etch-stopping layer.

Optionally, in the method, the modification treatment can be performed on the auxiliary electrode pattern after forming the auxiliary electrode pattern and prior to forming the first etch-stopping layer.

Preferably, the method can further comprise:

during forming the first etch-stopping layer, forming a second etch-stopping layer on the active layer;

prior to forming the transparent cathode, forming a via hole in the second etch-stopping layer; and forming a source and a drain on the second etch-stopping layer, wherein the source and the drain are electrically connected with the active layer by means of the via hole in the second etch-stopping layer, respectively.

Preferably, the method can further comprise:

forming a passivation layer on the gate insulating layer, wherein the passivation layer covers the first etch-stopping layer;

forming a via hole in the passivation layer; and during forming the transparent cathode, electrically connecting the transparent cathode with the auxiliary electrode though the via hole in the first etch-stopping layer and the via hole in the passivation layer.

Preferably, the method can further comprise:

forming a passivation layer on the gate insulating layer, wherein the passivation layer covers the source, the drain, and the first etch-stopping layer;

forming a via hole in the passivation layer; and during forming the transparent cathode, electrically connecting the transparent cathode with the auxiliary electrode though the via hole in the first etch-stopping layer and the via hole in the passivation layer.

Preferably, the method can further comprise:

forming a passivation layer on the gate insulating layer, wherein the passivation layer covers the source, drain, first etch-stopping layer and second etch-stopping layer;

forming a via hole in the passivation layer; and during forming the transparent cathode, electrically connecting the transparent cathode with the auxiliary electrode though the via hole in the first etch-stopping layer and the via hole in the passivation layer.

Preferably, prior to forming the transparent cathode, the method can further comprise: performing an annealing treatment on the auxiliary electrode.

Preferably, in the method, the modification treatment is a plasma treatment or ion implantation.

Preferably, the method can further comprise: forming an electron injection layer, an electron transporting layer, a light emitting layer, a hole transporting layer, a hole injection layer, and a reflective anode in sequence on the transparent cathode.

According to the above mentioned technical solutions, the active layer and the auxiliary electrode are arranged in a same layer, a pattern of the active layer and the auxiliary electrode can be formed by a same etching process, and a separate process for forming the auxiliary electrode is not required, thus reducing the overall process time of the array substrate and saving the fabricating cost.

BRIEF DESCRIPTION OF THE DRAWINGS

Features and advantages of the present invention can be clearly understood by referring to the accompanying drawings, which are schematic in nature and should not be interpreted as any limitation to the present invention.

Figure 1:
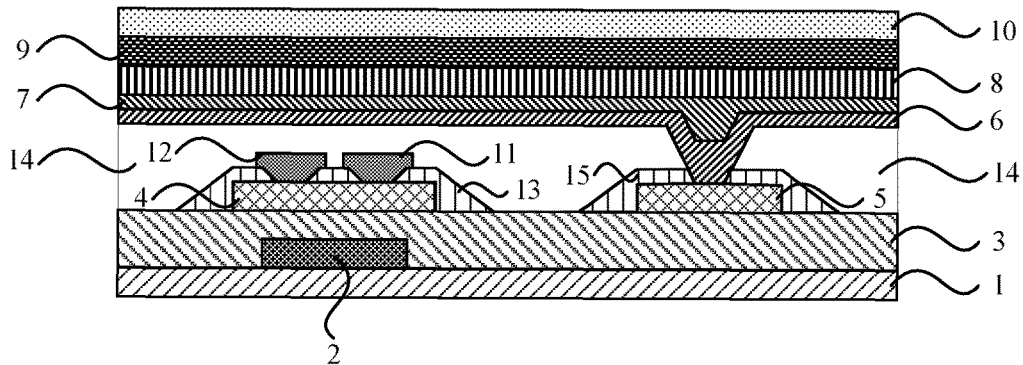
FIG. 1 is a structural view for an array substrate in an embodiment of the present invention.

REFERENCE NUMERALS IN DRAWINGS 1 substrate; 2 gate; 3 gate insulating layer; 4 active layer; 5 auxiliary electrode; 6 transparent cathode; 7 light emitting layer; 8 hole transporting layer; 9 hole injection layer; 10 reflective anode; 11 source; 12 drain; 13 second etch-stopping layer; 14 passivation layer; 15 first etch-stopping layer.

DETAILED DESCRIPTION OF THE INVENTION

The above objects, features and advantages of the present invention will be more apparent from the following with reference to the specific embodiments of the invention described in detail. It is noted that, embodiments of the present application and features in these embodiments can be combined without conflict.

In the following description, a number of specific details set forth in order to fully understand the present invention. However, the present invention can be carried out in a manner different from the embodiments described herein. Therefore, the present invention is not limited to specific embodiments disclosed below.

It is noted that size of a layer or region in drawings may be exaggerated for clarity. It is understood that when an element or layer is referred to as being "on" another element or layer, it can be directly on the other element or layer or an intervening layer may be present. Besides, it is understood that when an element or layer is referred to as "below" another element or layer, it can be directly below the other element, or one or more intermediate layer or element may be present. Besides, it is further understood that when a layer or element is referred to as being between two layers or two elements, this layer or element can be the unique layer between these two layers or two elements, or one or more intermediate layer or element may be present. The same reference numerals refer to the same or similar elements throughout the specification.

Unless defined otherwise, all technical and scientific terms used herein have the same meaning as is commonly understood by one of skill in the art. Use of words like "first", "second" and so on in the specification and claims does not indicate any ordering, quantity, or importance, but to distinguish between different components. Similarly, use of words like "a", "an" or "the" do not represent limitation in quantity, but to indicate "at least one". Use of words like "comprise" or "comprising" does not exclude the presence of elements or articles other than those stated. In the present invention, the term "a plurality of" refers to two or more, unless specifically stated otherwise.

As shown in FIG. 1, in an embodiment of the present invention, an array substrate comprises a thin film transistor (at a bottom left portion of FIG. 1), an auxiliary electrode 5 which is arranged in a same layer as an active layer 4 of the thin film transistor, and a transparent cathode 6 which is electrically connected with the auxiliary electrode 5, wherein the active layer 4 is an oxide semiconductor, the auxiliary electrode 5 is an oxide semiconductor which has been subject to a modification treatment. As used herein, the term "modification treatment" refers to any treatment which can convert the oxide semiconductor into an electric conductor. The modification treatment comprises, but not limited to, plasma treatment, ion implantation, or the like.

Preferably, the array substrate further comprises: a substrate 1, a gate 2 which is arranged on the substrate 1, a gate insulating layer 3 which is arranged on the gate 2, wherein the active layer 4 is arranged on the gate insulating layer 3.

In particular, a layer of oxide semiconductor over the gate insulating layer is etched by an etching process, forming a pattern of active layer and auxiliary electrode. Then, the auxiliary electrode pattern is subject to a modification treatment such as plasma treatment or ion implantation, improving the concentration of carrier in the layer of oxide semiconductor, so that the auxiliary electrode pattern is conductive to form an auxiliary electrode.

In the array substrate of the above mentioned embodiment, the active layer and the auxiliary electrode are arranged in a same layer. As a result, the layer of oxide semiconductor can be processed by a single etching process, to form the active layer and the auxiliary electrode at a same time. There is no need for a separate process to form the auxiliary electrode, thus simplifying the fabricating process of the array substrate and saving fabricating cost.

Generally, in order to prevent the auxiliary electrode from damage during forming the source/drain, the array substrate can further comprise a first etch-stopping layer 15 which is arranged on the auxiliary electrode 5, wherein a via hole is arranged in the first etch-stopping layer 15, the transparent cathode 6 is electrically connected with the auxiliary electrode 5 by means of the via hole in the first etch-stopping layer 15. Since the first etch-stopping layer is arranged on the auxiliary electrode, during fabricating the array substrate, the modification treatment is performed on the auxiliary electrode pattern through the first etch-stopping layer on the auxiliary electrode pattern, so that the auxiliary electrode pattern possesses conductivity to act as an auxiliary electrode.

Generally, the array substrate can further comprise a second etch-stopping layer 13 which is arranged on the active layer 4, and a source 11 and a drain 12 which are arranged on the second etch-stopping layer 13, wherein the source 11 and the drain 12 are electrically connected with the active layer 4 by means of the via hole in the second etch-stopping layer 13. The second etch-stopping layer can prevent the auxiliary electrode from damage during forming the source/drain.

Generally, the array substrate can further comprise: a passivation layer 14 which is arranged on the gate insulating layer 3 and covers the first etch-stopping layer 15, wherein the passivation layer 14 is provided with a via hole, the transparent cathode 6 is electrically connected with the auxiliary electrode 5 by means of the via hole in the first etch-stopping layer 15 and the via hole in the passivation layer 14.

Preferably, the array substrate can further comprise: a passivation layer 14 which is arranged on the gate insulating layer 3 and covers the source 11, the drain 12 and the first etch-stopping layer 15, wherein the passivation layer 14 is provided with a via hole, the transparent cathode 6 is electrically connected with the auxiliary electrode 5 by means of the via hole in the first etch-stopping layer 15 and the via hole in the passivation layer 14.

Preferably, the array substrate can further comprise: a passivation layer 14 which is arranged on the gate insulating layer 3 and covers the first etch-stopping layer 15, the source 11, the drain 12, and the second etch-stopping layer 13, wherein the passivation layer 14 is provided with a via hole, the transparent cathode 6 is electrically connected with the auxiliary electrode 5 by means of the via hole in the first etch-stopping layer 15 and the via hole in the passivation layer 14. The passivation layer 14 can avoid intrusion of foreign impurities.

Generally, the array substrate can further comprise: an electron injection layer, an electron transporting layer (not shown), a light emitting layer 7, a hole transporting layer 8, a hole injection layer 9, and a reflective anode 10, which are arranged in sequence on the transparent cathode 6.

It is understood that the construction in the present embodiment is described in the context of an array substrate in an inverted OLED, but the construction of the auxiliary electrode and the active layer in the present invention is also applicable to other array substrate with an auxiliary electrode.

The present invention further provides a display device, which comprises any one of the above mentioned array substrate.

Apart from the array substrate in the present embodiment, for example, the display device can further comprise a color filter substrate.

It is noted that the display device in the present embodiment can be any product or component with display function, such as electronic paper, mobile phone, tablet computer, TV, notebook computer, digital photo frame, and navigator.

Figure 2:
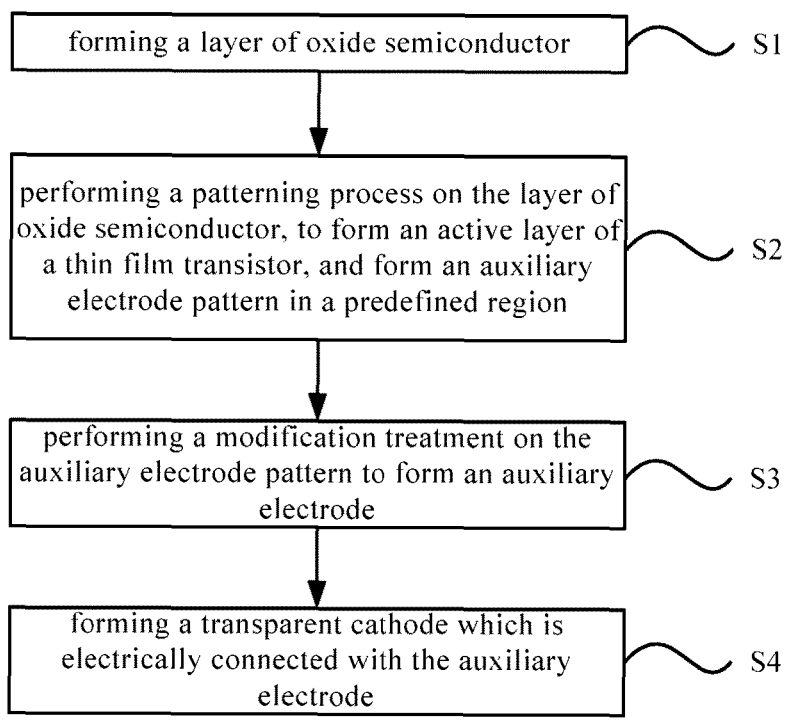
FIG. 2 is a schematic view for a method for fabricating an array substrate in an embodiment of the present invention.

As shown in FIG. 2, in an embodiment of the present invention, a method for fabricating an array substrate comprises:

step S1, forming a layer of oxide semiconductor;

step S2, performing a patterning process on the layer of oxide semiconductor, to form an active layer 4 of a thin film transistor, and form an auxiliary electrode pattern in a predefined region;

step S3, performing a modification treatment on the auxiliary electrode pattern to form an auxiliary electrode 5; and step S4, forming a transparent cathode 6 which is electrically connected with the auxiliary electrode 5.

It is understood by a skilled in the art that each of these layers can be formed by various processes, which generally comprise depositing a material layer and etching the material layer to form a pattern. Of course, other patterning processes can be applied. Any technical solution which is identical, similar or equivalent to those recited in claims of the present invention shall fall within the protection scope of the present invention, regardless of the process for forming these layers.

In the method of the above mentioned embodiment, the layer of oxide semiconductor is processed by a single etching process to form the active layer 4 and the auxiliary electrode 5. There is no need for a separate process to form the auxiliary electrode 5, thus simplifying the fabricating process of the array substrate and saving fabricating cost.

Generally, prior to forming the layer of oxide semiconductor (step S1), the method can further comprise:

forming a gate 2 on a substrate 1;

forming a gate insulating layer 3 on the gate 2; and forming a layer of oxide semiconductor on the gate insulating layer 3.

Generally, after performing the patterning process on the layer of oxide semiconductor, the method can further comprise:

forming a first etch-stopping layer 15 on the layer of oxide semiconductor in a predefined region, and performing the modification treatment on the auxiliary electrode pattern can comprise:

performing a modification treatment like plasma treatment or ion implantation on the auxiliary electrode pattern through the first etch-stopping layer 15, or after forming the auxiliary electrode pattern and prior to forming the first etch-stopping layer 15, performing the modification treatment like plasma treatment or ion implantation on the auxiliary electrode pattern.

The sequence for performing the modification treatment on the auxiliary electrode pattern can be set as needed. The modification treatment can be performed directly on the auxiliary electrode pattern once it is formed. Alternatively, after the first etch-stopping layer 15 is formed, the modification treatment is performed on the auxiliary electrode pattern through the first etch-stopping layer 15. In particular, the modification treatment for example can be a plasma treatment, a plasma implantation process or the like, so that the auxiliary electrode pattern is reduced in resistance and becomes an electric conductor.

Figure 3:
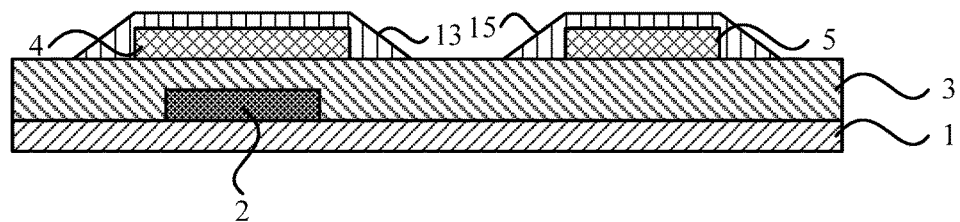
FIG. 3 is a schematic view for a first and a second etch-stopping layer which are formed in an embodiment of the present invention.

Generally, as shown in FIG. 3, the method can further comprise: forming a second etch-stopping layer 13 on the active layer 4 during forming the first etch-stopping layer 15. Namely, both the first etch-stopping layer 15 and the second etch-stopping layer 13 are formed in a same patterning process. In particular, an etch-stopping layer which covers the active layer 4 and the auxiliary electrode 5 can firstly be formed on the gate insulating layer 3. Then, the etch-stopping layer is etched in such a manner that the etch-stopping layer over the active layer 4 and the auxiliary electrode 5 is remained. The second etch-stopping layer 13 over the active layer 4 and the etch-stopping layer 15 over the auxiliary electrode 5 can prevent the active layer 4 and the auxiliary electrode 5 from being etched during forming the source 11 and the drain 12.

Figure 4:
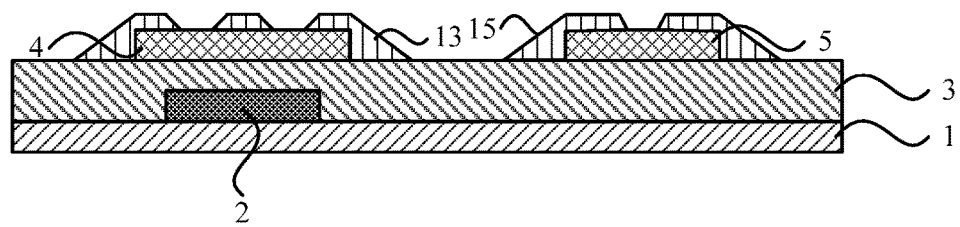
FIG. 4 is a schematic view for a via hole which is formed in a first and a second etch-stopping layer in an embodiment of the present invention.
Figure 5:
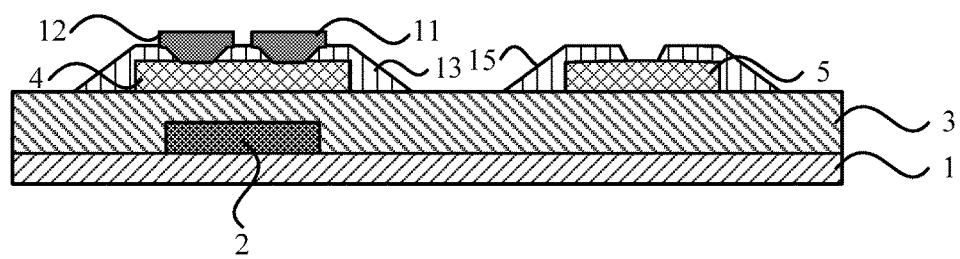
FIG. 5 is a schematic view for a source and a drain which are formed on a second etch-stopping layer in an embodiment of the present invention.

As shown in FIGS. 4-5, prior to forming the transparent cathode 6, the method can further comprise:

forming a via hole in the second etch-stopping layer 13, forming a source 11 and a drain 12 on the second etch-stopping layer 13, and electrically connecting the source 11 and the drain 12 with the active layer 4 by means of the via hole in the second etch-stopping layer 13.

As shown in FIG. 5, generally, during forming the via hole in the second etch-stopping layer 13, a via hole is also formed in the first etch-stopping layer 15.

Figure 6:
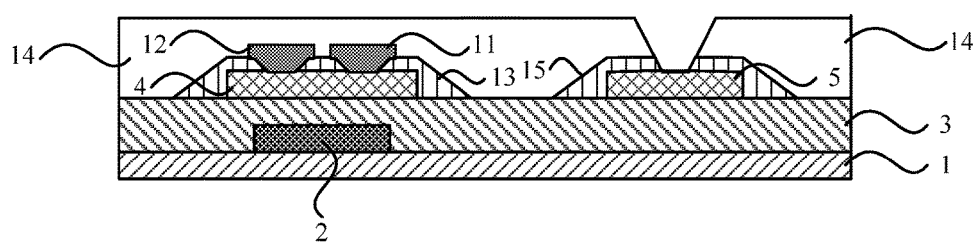
FIG. 6 is a schematic view for a passivation layer which is formed in an embodiment of the present invention.

As shown in FIG. 6, the method can further comprise: forming a passivation layer 14 on the gate insulating layer 3, so that the passivation layer 14 covers the first etch-stopping layer 15, and forming a via hole in the passivation layer 14. During forming the transparent cathode 6, the transparent cathode 6 is electrically connected with the auxiliary electrode 5 by means of the via hole in the first etch-stopping layer 15 and the via hole in the passivation layer 14, as shown in FIG. 1.

As shown in FIG. 6, the method can further comprise: forming the passivation layer 14 on the gate insulating layer 3, so that the passivation layer 14 covers the source 11, the drain 12, and the first etch-stopping layer 15, and forming a via hole in the passivation layer 14. During forming the transparent cathode 6, the transparent cathode 6 is electrically connected with the auxiliary electrode 5 by means of the via hole in the first etch-stopping layer 15 and the via hole in the passivation layer 14, as shown in FIG. 1.

As shown in FIG. 6, the method can further comprise: forming the passivation layer 14 on the gate insulating layer 3. The passivation layer 14 not only covers the first etch-stopping layer 15, but also covers the source 11, the drain 12, and the second etch-stopping layer 13, thus avoiding intrusion of foreign impurities. Then, a via hole is formed in the passivation layer 14 at a position corresponding to the via hole in the first etch-stopping layer 15, so that the transparent cathode can be electrically connected with the auxiliary electrode 5 by means of the via hole in the passivation layer 14 and the via hole in the first etch-stopping layer 15.

Preferably, the method further comprises: performing an annealing treatment on the auxiliary electrode 5. By means of the annealing treatment, it is possible to eliminate residual stress, stabilize size, reduce deformation and cracking tendency, refine grain, adjust texture, and eliminate structural defects.

Preferably, the method further comprises: forming an electron injection layer, an electron transporting layer, a light emitting layer 7, a hole transporting layer 8, a hole injection layer 9, and a reflective anode 10 in sequence on the transparent cathode 6. The resulting array structure is shown in FIG. 1.

Technical solutions of the present invention have been described in details by referring to the accompanying drawings. In the related technology, in an inverted OLED, a separate process is needed for fabricating an auxiliary electrode, which increases the times of processes and fabricating cost. In the technical solution of the present invention, an active layer and an auxiliary electrode can be formed by a same etching process at a same time, and a separate process for forming the auxiliary electrode is not required, thus reducing the overall process time of array substrate and saving fabricating cost.

It is understood by the skilled in the art that both the above mentioned array substrate and the fabricating method thereof are described by taking an OLED array substrate as an example. Therefore, the array substrate and the fabricating method thereof in the present invention is applicable to an OLED array substrate and fabricating method thereof. However, the present invention is not limited to the OLED array substrate, and any array substrate and fabricating method thereof which is substantially the same or similar with a technical solution recorded in any claim of the present invention shall fall within the protection scope of the present invention.

Although the present invention has been described above with reference to specific embodiments, it should be understood that the limitations of the described embodiments are merely for illustrative purpose and by no means limiting. Instead, the scope of the invention is defined by the appended claims rather than by the description, and all variations that fall within the range of the claims are intended to be embraced therein. Thus, other embodiments than the specific ones described above are equally possible within the scope of these appended claims.

The invention claimed is:

1. An array substrate, comprising: a thin film transistor, an auxiliary electrode, and a transparent cathode which is electrically connected with the auxiliary electrode, wherein both the auxiliary electrode and an active layer of the thin film transistor are directly arranged on a gate insulating layer of the thin film transistor, the active layer comprises an oxide semiconductor, and the auxiliary electrode is an electric conductor comprising a modified oxide semiconductor,
wherein the array substrate further comprises a first etch-stopping layer which is arranged on the auxiliary electrode, and a passivation layer which is arranged on the gate insulating layer and covers the first etch-stopping layer,
wherein a via hole is arranged in the passivation layer, a via hole is arranged in the first etch-stopping layer, and the transparent cathode is electrically connected with the auxiliary electrode through the via hole in the first etch-stopping layer and the via hole in the passivation layer.

2. The array substrate of claim 1, wherein the array substrate further comprises:
a substrate; and a gate which is arranged over the substrate wherein the gate insulating layer is arranged on the gate.

3. The array substrate of claim 1, wherein the array substrate further comprises:
a second etch-stopping layer which is arranged on the active layer, and a source and a drain which are arranged on the second etch-stopping layer, wherein the source and the drain are electrically connected with the active layer by means of the via hole in the second etch-stopping layer, respectively.

4. The array substrate of claim 3,
wherein the passivation layer further covers the source and the drain.

5. The array substrate of claim 3,
wherein the passivation layer further covers the source, the drain, and the first etch stopping layer.

6. The array substrate of claim 1, wherein the auxiliary electrode is an electric conductor which is formed by performing a plasma treatment or ion implantation on the oxide semiconductor.

7. The array substrate of claim 1, wherein the array substrate further comprises: an electron injection layer, an electron transporting layer, a light emitting layer, a hole transporting layer, a hole injection layer, and a reflective anode which are arranged in sequence over the transparent cathode.

8. A display device, comprising the array substrate of claim 1.

9. A method for fabricating an array substrate, comprising:
forming a gate on a substrate;
forming a gate insulating layer on the gate;
forming a layer of oxide semiconductor on the gate insulating layer;
performing a patterning process on the layer of oxide semiconductor, to form an active layer of a thin film transistor, and form an auxiliary electrode pattern in a predefined region;
forming a first etch-stopping layer on the auxiliary electrode pattern;
performing a modification treatment on the auxiliary electrode pattern through the first etch-stopping layer to form an auxiliary electrode;
forming a passivation layer on the gate insulating layer, wherein the passivation layer covers the first etch-stopping layer;
forming a via hole in the passivation layer and a via hole in the first etch-stopping layer; and
forming a transparent cathode which is electrically connected with the auxiliary electrode through the via hole in the first etch-stopping layer and the via hole in the passivation layer.

10. The method of claim 9, wherein the method further comprises:
during forming the first etch-stopping layer, forming a second etch-stopping layer on the active layer;
prior to forming the transparent cathode, forming a via hole in the second etch-stopping layer; and
forming a source and a drain on the second etch-stopping layer, wherein the source and the drain are electrically connected with the active layer by means of the via hole in the second etch-stopping layer, respectively.

11. The method of claim 10,
wherein the passivation layer further covers the source and the drain.

12. The method of claim 10,
wherein the passivation layer further covers the source, the drain, and the first etch stopping layer.

13. The method of claim 9, wherein prior to forming the transparent cathode, the method further comprises: performing an annealing treatment on the auxiliary electrode.

* * * * *